United States Patent
Hu et al.

(10) Patent No.: US 6,467,278 B1
(45) Date of Patent: Oct. 22, 2002

(54) COOLING FOR SINGULATION OF COMPOSITE MATERIALS IN MOLDED SEMICONDUCTOR PACKAGES

(75) Inventors: Ah Lek Hu, Melaka (MY); Sharon Mei Wan Ko, Melaka (MY); Peng Yeen Chan, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/714,369

(22) Filed: Nov. 15, 2000

(51) Int. Cl.[7] .............................................. F25D 17/02
(52) U.S. Cl. ................. 62/62; 62/320; 83/171
(58) Field of Search ............................. 62/320, 62, 64; 83/171

(56) References Cited

U.S. PATENT DOCUMENTS

| | | | | |
|---|---|---|---|---|
| 2,815,562 A | * | 12/1957 | Wilkie et al. .................. | 83/171 |
| 2,838,825 A | * | 6/1958 | Knollenberg ................ | 83/171 |
| 3,605,551 A | * | 9/1971 | Steward ........................ | 83/171 |
| 4,091,580 A | * | 5/1978 | Oates ........................... | 83/171 |
| 4,140,046 A | * | 2/1979 | Marbach ....................... | 83/171 |
| 5,207,815 A | * | 5/1993 | Wright ......................... | 83/171 |
| 5,678,466 A | * | 10/1997 | Wahl ............................ | 83/168 |
| 6,354,285 B1 | * | 3/2002 | Licht et al. ............... | 125/13.01 |

* cited by examiner

Primary Examiner—Ronald Capossela
(74) Attorney, Agent, or Firm—Beyer Weaver & Thomas, LLP

(57) ABSTRACT

A cooling system to reduce damage resulting from panel singulation is provided. A panel may be formed by encapsulating a lead frame with mounted dice. The encapsulating material may be a composite, plastic, or ceramic. Singulation may be a cutting done by laser, water jet, or saw. A chiller system cools a fluid, such as water, to a temperature below 16° C. The cooled fluid is dispensed to a part of the panel being singulated. For example, if a circular saw is used to cut the panel, a plurality of nozzles may be used to direct the fluid to the part of the saw cutting the panel, which defines the part of the panel being singulated. The cooled fluid, cools the panel preventing burring, smearing, and melting of metal contacts.

20 Claims, 4 Drawing Sheets

US 6,467,278 B1

COOLING FOR SINGULATION OF COMPOSITE MATERIALS IN MOLDED SEMICONDUCTOR PACKAGES

FIELD OF THE INVENTION

The present invention relates generally to integrated circuit packages. More specifically, the invention relates to the singulation of integrated circuit packages.

BACKGROUND OF THE INVENTION

An integrated circuit (IC) package encapsulates an IC chip (die) in a protective casing and may also provide power and signal distribution between the IC chip and an external printed circuit board (PCB). An IC package may use a metal lead frame to provide electrical paths for that distribution.

To facilitate discussion, FIG. 1 is a top view of a top view of a lead frame panel 100 made up for a plurality of lead frames that may be used in the prior art. The lead frame may comprise leads 108, die attach pads 112, ties 116 for supporting the die attach pads 112, and a skirt 120 for supporting the plurality of leads 108 and ties 116. The lead frame panel 100 may be etched or stamped from a thin sheet of metal. IC chips 124 may be mounted to the die attach pads 112 by an adhesive epoxy. Wire bonds 128, typically of fine gold wire, may then be added to electrically connect the IC chips 124 to the leads 108. Each IC chip 124 may then be encapsulated with part of the leads 108 and the die attach pad 112 in a protective casing, which may be produced by installing a preformed composite, plastic or ceramic housing around each IC chip or by dispensing and molding a layer of encapsulation material (mold compound), such as a composite or plastic material, over all IC chips 124. FIG. 2 is a cross-sectional view of part of the lead frame panel 100 and IC chips 124 that has been encapsulated by an encapsulation material 140, such as composite or plastic. The encapsulated IC chips are singulated. Dashed line 132 indicates a singulation line. FIG. 3 is a bottom view of a single singulated encapsulated IC chip 300. The encapsulation material 140, die attach pad 112 and leads 108 are shown.

Since during the singulation process, the cutting of encapsuration material, metal leads, and silicon is achieved, the method of singulation is very critical. If a sawing method is used for singulation, the metal in the lead or frame may smear or burr due to heat generated by the sawing process. Other methods of singulation may be by laser or water jet, which may also generate heat and cause unwanted damage. Such singulation methods may cause the metal leads to smear, caused by melting, or burr, which may cause shorting between the leads. Solder or lead may also melt disrupting electrical connections. In FIG. 3, shorting 304 between the leads is shown.

It is desirable to provide an IC package singulation process, which reduces damage to the encapsulated IC packages, such as shorting, metal lead smear, melting, or burring.

SUMMARY OF THE INVENTION

To achieve the foregoing and other objects and in accordance with the purpose of the present invention, a variety of techniques is provided for making packaged chips. Generally, a panel is placed in a singulating device. Fluid is placed in a chiller system. The fluid is cooled in the chiller system. The cooled fluid is provided to an area of the panel to be singulated. The panel is then singulated.

Another aspect of the invention provides an apparatus for singulating a panel of encapsulated dice. A singulating device for cutting the panel is provided. A chiller system for cooling a fluid is provided to the singulating device. A dispenser for directing the cooled fluid to an area of the panel being singulated is provided to the chiller system.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
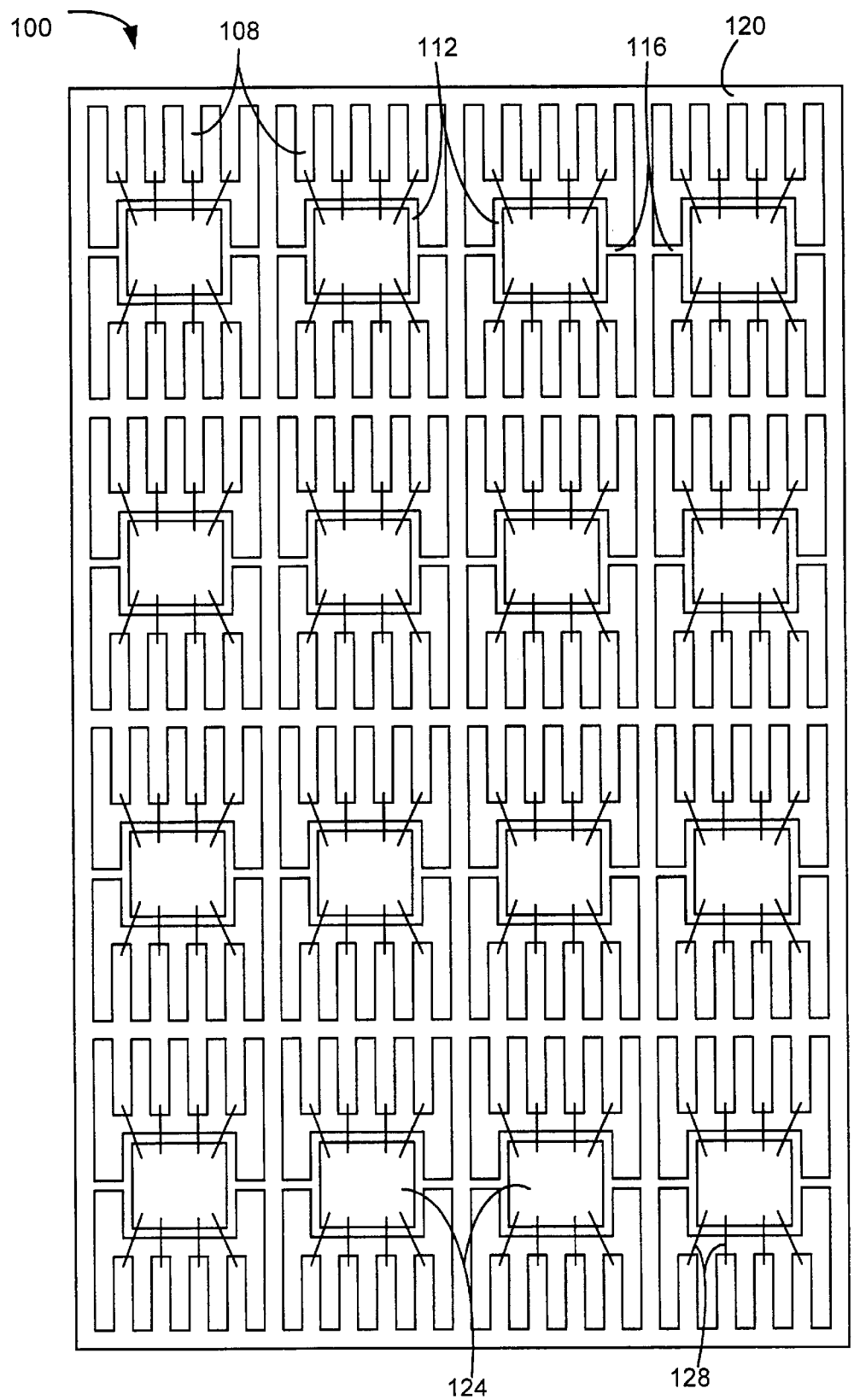
FIG. 1 is a plan view of a lead frame and die assembly used in the prior art.
Figure 2:
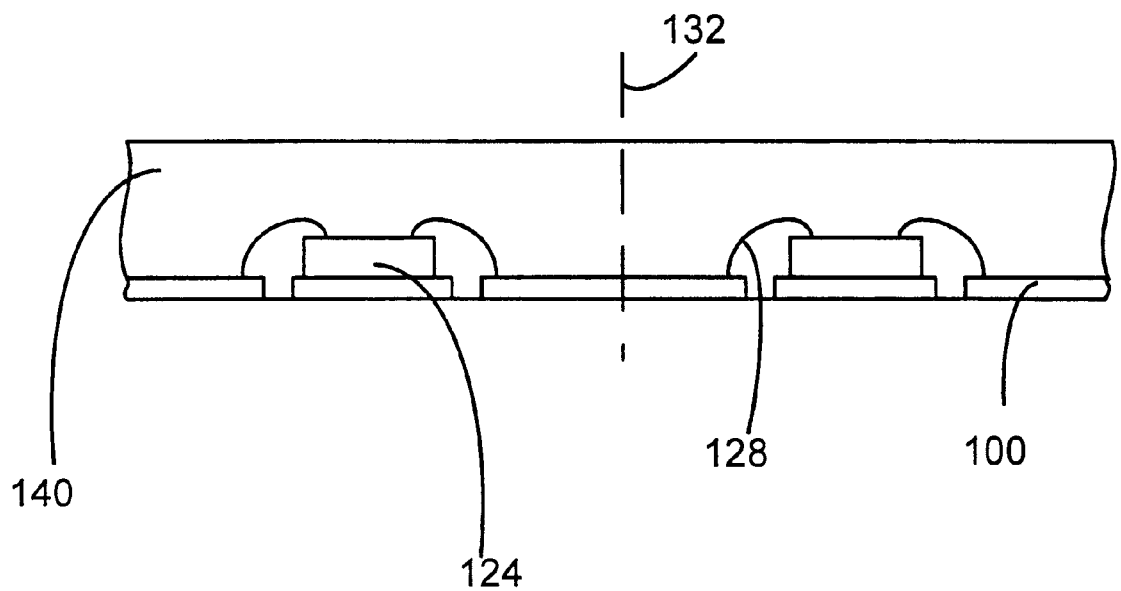
FIG. 2 is a cross-sectional view of part of the lead frame panel illustrated in FIG. 1 after encapsulation, provided by the prior art.
Figure 3:
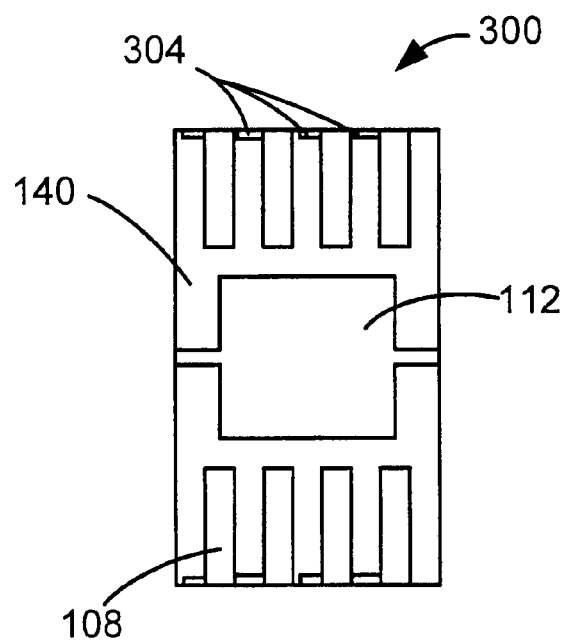
FIG. 3 is a bottom view of a singulated encapsulated chip on part of a lead frame provided by the prior art.
Figure 4:
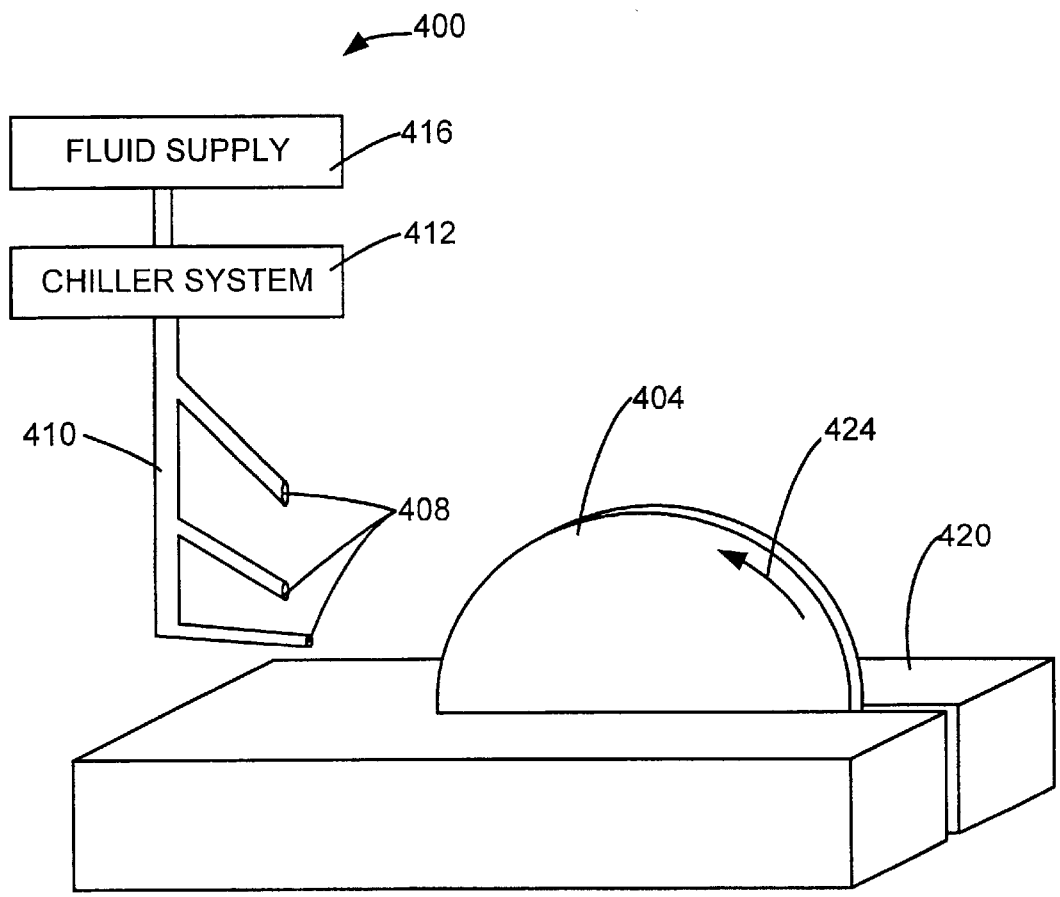
FIG. 4 is a schematic view of a singulating system.

To facilitate discussion, FIG. 4 is a schematic view of a singulation device 400 that may be used in the practice of a preferred embodiment of the invention. The singulation device 400 comprises a cutting device 404, such as a circular saw. Fluid nozzles 408 are used to provide a fluid, such as water, to the cutting area to provide lubrication to the cutting device 404. A chiller system 412 is in fluid connection with the nozzles 408 through a piping 410. A fluid supply 416 is in fluid connection with the cooler.

Figure 5:
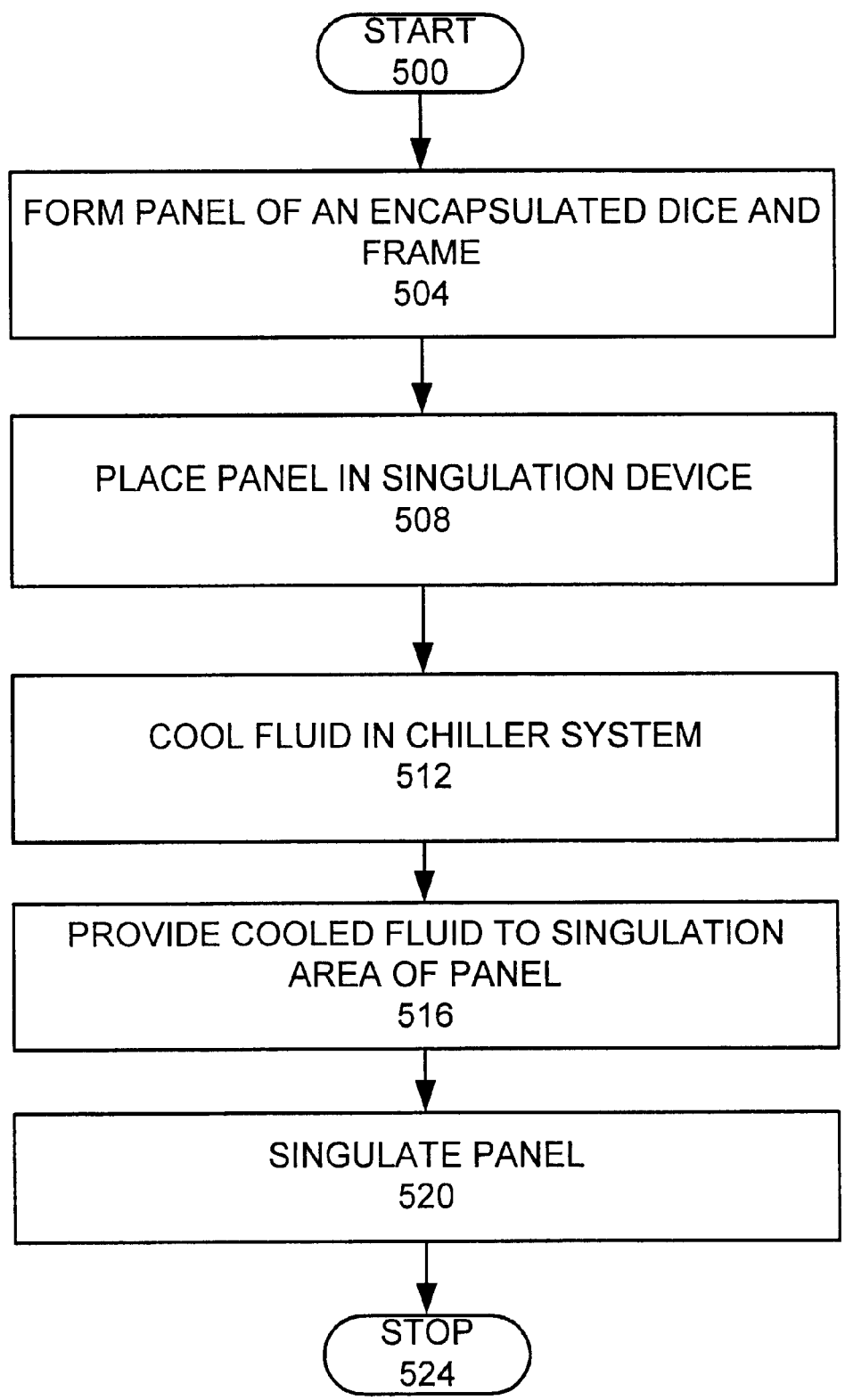
FIG. 5 is a flow chart of a process used by the invention.

FIG. 5 is a flow chart of a method used in a preferred embodiment of the invention. First a panel is formed from an encapsulated frame and dice (step 504). The panel 420 is placed in a singulation device 400 (step 508). The fluid supply 416 supplies fluid to the chiller system 412. The chiller system 412 cools the fluid to a temperature below 16° C. (step 572). More preferably, the chiller system 412 cools the fluid to a temperature below 12° C. More preferably, the chiller system 412 cools the fluid to a temperature between −10° C. and 10° C. The cooled fluid is then provided to a singulation area of the panel 420 (step 516). In the preferred embodiment, this is done by providing the cooled fluid to the nozzles 408, which spray the cooled fluid to an area of the panel 420 being cut by the singulation device 400. The saw is rotated as indicated by a rotational arrow 424, so that the fluid is drawn by the saw to the part of the panel being cut. As the saw is rotated, the panel is also cut to provide singulation (step 520). The fluid maintains the metal in the panel 420 at a sufficiently low temperature to prevent shorting, metal lead smear, melting, or burring.

In another embodiment of the invention, another type of singulation device, such as laser or water jet may be used. Another method of cooling the part of the panel being singulated to a temperature below 16° C. may be provided. Generally, a fluid would be cooled below 16° C. and then would be directed to a singulation area of a panel, where the panel is being cut. The fluid may be collected and recycled to the fluid supply. In such a case, the collected fluid may be heated by the cutting. The chiller system 412 would then cool the heated fluid to below 16° C. In another embodiment, the chiller system may be placed before the fluid supply, so that the fluid is cooled before it enters the fluid supply.

It should be noted that the fluid being cooled may be a liquid or a gas or a combination of a liquid and a gas.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of making packaged chips, comprising:
    placing a panel in a singulating device;
    placing fluid in a chiller system;
    cooling the fluid in the chiller system;
    providing the cooled fluid to an area of the panel to be singulated; and
    singulating the panel.

2. The method, as recited in claim 1, wherein the cooling fluid is cooled by the chiller to a temperature below 16° C.

3. The method, as recited in claim 2, further comprising:
    placing a plurality of dice on a lead frame; and
    encapsulating the lead frame and dice to form the panel.

4. The method, as recited in claim 3, wherein the providing cooled fluid to an area, comprises:
    directing the cooled fluid from the chiller system to at least one nozzle; and
    directing the cooled fluid from the nozzle to the area of the panel being singulated.

5. The method, as recited in claim 4, wherein singulating the panel, comprises sawing the panel.

6. The method, as recited in claim 5, wherein the sawing the panel comprises sawing the panel with a rotating saw.

7. The method, as recited in claim 6, wherein the rotating saw rotates in a direction that draws the cooled fluid to the area of the panel being singulated.

8. The method, as recited in claim 7, wherein the chiller system cools the fluid to a temperature below 12° C.

9. The method, as recited in claim 7, wherein the chiller system cools the fluid to a temperature between −10° C. and 10° C.

10. The method, as recited in claim 2, wherein the chiller system cools the fluid to a temperature below 16° C.

11. The method, as recited in claim 2, wherein the chiller system cools the fluid to a temperature between −10° C. and 10° C.

12. The method, as recited in claim 1, wherein the chiller system cools the fluid to a temperature below 16° C.

13. The method, as recited in claim 1, wherein the chiller system cools the fluid to a temperature between −10° C. and 10° C.

14. The method, as recited in claim 1, wherein the fluid is a liquid fluid.

15. An apparatus for singulating a panel of encapsulated dice, comprising:
    a singulating device for cutting the panel;
    a chiller system for cooling a fluid; and
    a dispenser for directing the cooled fluid to an area of the panel being singulated.

16. The apparatus, as recited in claim 15, wherein the chiller system, comprises a system for cooling the fluid to a temperature below 16° C.

17. The apparatus, as recited in claim 16, wherein the dispenser, comprises:
    at least one nozzle for directing the fluid to the area of the panel being singulated; and
    a pipe extending from the chiller system to the at least one nozzle.

18. The apparatus, as recited in claim 16, wherein the singulating device, comprises a saw.

19. The apparatus, as recited in claim 18, wherein the singulating device comprises a circular saw.

20. The apparatus, as recited in claim 16, wherein the system for cooling the fluid cools a liquid fluid.

\* \* \* \* \*